(12) United States Patent
Tang

(10) Patent No.: US 12,453,158 B2
(45) Date of Patent: Oct. 21, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Jifeng Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 429 days.

(21) Appl. No.: 18/149,219

(22) Filed: Jan. 3, 2023

(65) Prior Publication Data

US 2023/0223450 A1  Jul. 13, 2023

(30) Foreign Application Priority Data

Jan. 13, 2022 (CN) .......................... 202210037570.2

(51) Int. Cl.
*H10D 64/01* (2025.01)
*H01L 21/311* (2006.01)
(Continued)

(52) U.S. Cl.
CPC ..... *H10D 64/251* (2025.01); *H01L 21/31144* (2013.01); *H10D 64/01* (2025.01); *H10D 64/62* (2025.01)

(58) Field of Classification Search
CPC .... H10D 64/251; H10D 64/62; H10D 12/035; H10D 12/491
See application file for complete search history.

(56) References Cited

U.S. PATENT DOCUMENTS 8,455,952 B2  6/2013  Lin et al.
9,299,711 B2  3/2016  Song et al.
(Continued)

FOREIGN PATENT DOCUMENTS

CN    102479789 A    5/2012
CN    103681865 B    3/2018
(Continued)

OTHER PUBLICATIONS

International Search Report cited in PCT/CN2022/093898 mailed Sep. 28, 2022, 8 pages.
(Continued)

*Primary Examiner* — Wasiul Haider
(74) *Attorney, Agent, or Firm* — Kilpatrick Townsend & Stockton LLP

(57) ABSTRACT

The present disclosure provides a semiconductor structure and a manufacturing method thereof, and relates to the technical field of semiconductors. The semiconductor structure includes a base, first contact structures, second contact structure, and third contact structures. The base includes an active region, and a source region, a gate region, and a drain region that are sequentially adjacent to each other are formed in the active region; the first contact structures are provided on the source region and the drain region; the second contact structure is provided on the gate region; the third contact structures are provided on first contact structures and the second contact structure, an area of a top surface of the first contact structure and an area of a top surface of the second contact structure are both larger than an area of a bottom surface of the third contact structure.

10 Claims, 7 Drawing Sheets

(51) Int. Cl.
*H10D 64/23* (2025.01)
*H10D 64/62* (2025.01)

(56) References Cited

U.S. PATENT DOCUMENTS

| | | | |
|---|---|---|---|
| 10,985,211 | B1 | 4/2021 | Lee et al. |
| 11,114,444 | B2 | 9/2021 | Tsai |
| 11,482,602 | B2 | 10/2022 | Song et al. |
| 2007/0246787 | A1 | 10/2007 | Wang et al. |
| 2020/0118873 | A1* | 4/2020 | Tsai .................. H10D 30/0212 |
| 2020/0303264 | A1* | 9/2020 | Park .................. H10D 84/0149 |
| 2021/0375758 | A1 | 12/2021 | Huang et al. |
| 2022/0093790 | A1 | 3/2022 | Glass et al. |
| 2022/0270971 | A1* | 8/2022 | Wang .................... H10D 30/43 |
| 2023/0130088 | A1 | 4/2023 | Xie et al. |

FOREIGN PATENT DOCUMENTS

| | | | |
|---|---|---|---|
| CN | 111987071 | A | 11/2020 |
| CN | 112151377 | A | 12/2020 |
| CN | 112786562 | A | 5/2021 |
| CN | 113113488 | A | 7/2021 |

OTHER PUBLICATIONS

Non-final office action issued in corresponding U.S. Appl. No. 17/954,582 mailed on Mar. 19, 2025, 10 pages.

* cited by examiner

SEMICONDUCTOR STRUCTURE AND MANUFACTURING METHOD THEREOF

CROSS-REFERENCE TO RELATED APPLICATIONS

This application claims the priority of Chinese Patent Application No. 202210037570.2, submitted to the Chinese Intellectual Property Office on Jan. 13, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

The dynamic random access memory (DRAM) has advantages such as a small size, a high degree of integration, and low power consumption, and has a faster read/write speed than the read-only memory (ROM). With the development of the semiconductor industry and the increase in the level of integration of the semiconductor structure, sizes of the DRAM and other devices are constantly reduced. Correspondingly, sizes of devices in the core region of the semiconductor structure also need to be reduced. In addition, due to limitations of design rules, the contact size in the core region also has to be reduced, resulting in high resistance of the contact, which reduces the performance of the semiconductor structure.

SUMMARY

An overview of the subject described in detail in the present disclosure is provided below.

The present disclosure provides a semiconductor structure and a manufacturing method thereof.

A first aspect of the embodiments of the present disclosure provides a semiconductor structure, including:
- a base, wherein the base includes an active region, and a source region, a gate region, and a drain region that are sequentially adjacent to each other are formed in the active region;
- first contact structures, provided on the source region and the drain region;
- second contact structure, provided on the gate region; and
- third contact structures, provided on the first contact structures and the second contact structure, wherein an area of a top surface of the first contact structure and an area of a top surface of the second contact structure are both larger than an area of a bottom surface of the third contact structure, a first interface exists between the first contact structure and the third contact structure, and a second interface exists between the second contact structure and the third contact structure.

A second aspect of the embodiments of the present disclosure provides a method of manufacturing a semiconductor structure, including:
- providing a base, wherein an active region is formed on the base, and the active region includes a source region, a gate region, and a drain region that are sequentially adjacent to each other;
- forming a first contact structure on each of the source region and the drain region, and forming a second contact structure on the gate region; and
- forming a third contact structure on each of the first contact structures and the second contact structure, wherein an area of a bottom surface of the first contact structure and an area of a bottom surface of the second contact structure are both larger than an area of a top surface of the third contact structure.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

Figure 1:
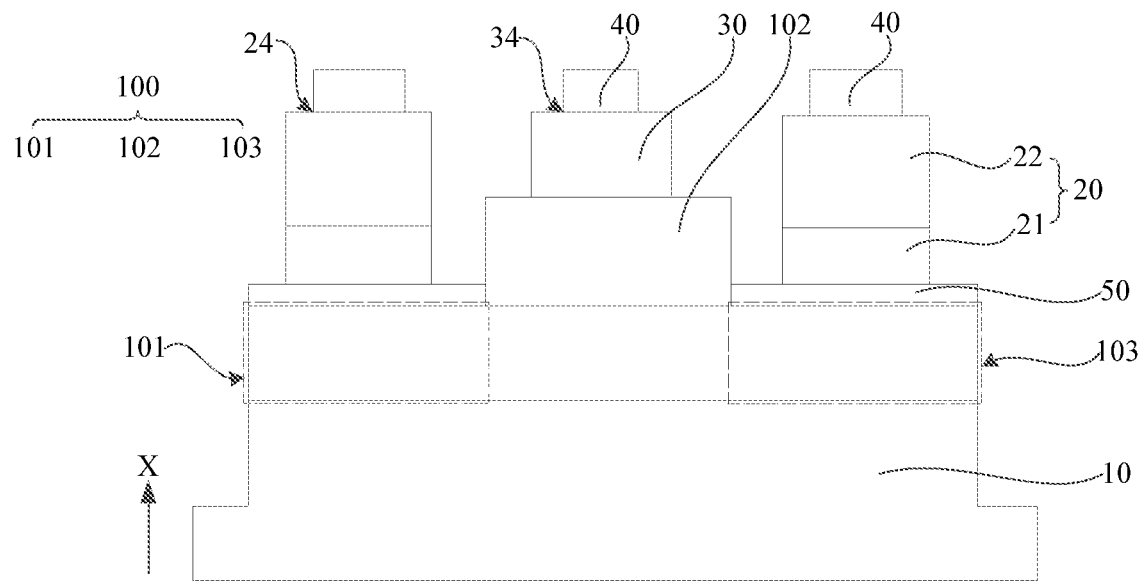
FIG. 1 is a front view of a semiconductor structure according to an exemplary embodiment.

REFERENCE NUMERALS 10. base; 20. first contact structure;
21. adhesive layer; 22. conductive layer;

24. first interface; 30. second contact structure; 34. second interface; 40. third contact structure; 50. contact layer; 51. initial contact layer; 52. cobalt layer; 60. dielectric layer; 70. first hard mask layer; 80. first photoresist layer; 81. second photoresist layer; 82. photomask; 83. mask pattern; 90. first contact hole; 100. active region; 101. source region; 102. gate region; 103. drain region; 110. second hard mask layer; 120. third contact hole; 130. second contact hole; H1. second preset thickness; H2. first preset thickness.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

With the development of the semiconductor industry and the increase in the level of integration of the semiconductor structure, sizes of the DRAM and other devices are constantly reduced. Therefore, sizes of devices in the core region of the semiconductor structure also need to be reduced continuously. In addition, due to design rules, the size of the contract structure in the core region also has to be reduced, resulting in high resistance of the contact, which reduces the performance of the semiconductor structure.

Figure 2:
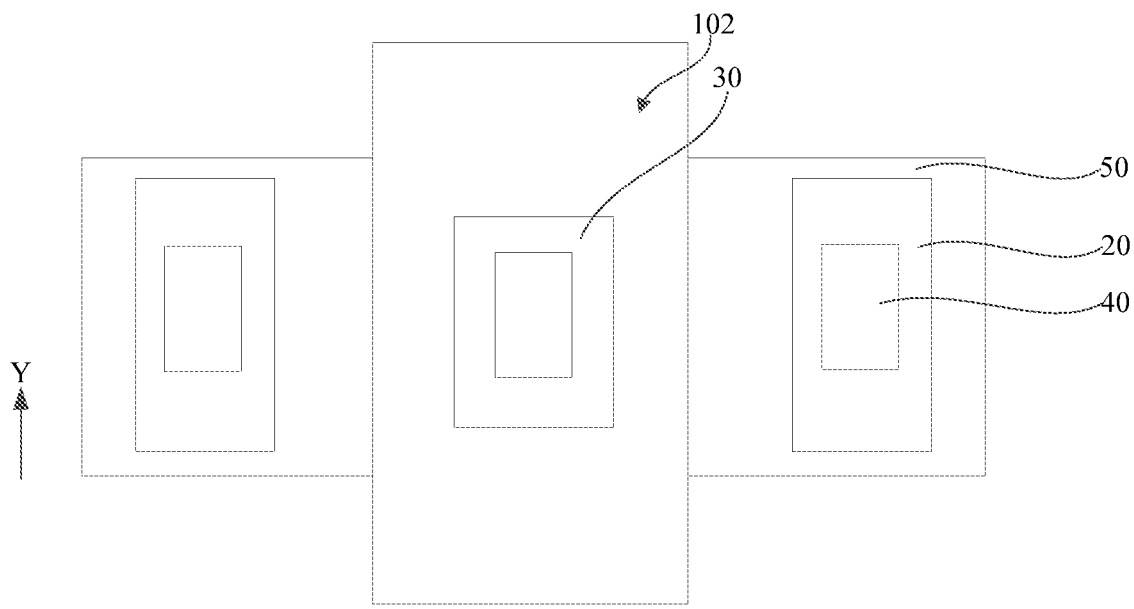
FIG. 2 is a top view of FIG. 1.

To solve one of the foregoing technical problems, an exemplary embodiment of the present disclosure provides a semiconductor structure, as shown in FIG. 1. FIG. 2 is a top view of a semiconductor structure according to an exemplary embodiment. The semiconductor structure is described below with reference to FIG. 1 to FIG. 2.

The semiconductor structure is not limited in this embodiment. That the semiconductor structure is a DRAM is used as an example below for description, but this embodiment is not limited thereto. Alternatively, the semiconductor structure in this embodiment may be other structures.

As shown in FIG. 1 and FIG. 2, an exemplary embodiment of the present disclosure provides a semiconductor structure. The semiconductor structure includes a base 10, first contact structures 20, second contact structure 30, and third contact structures 40.

Referring to FIG. 1, in some embodiments, the base 10 may be made of a semiconductor material. The semiconductor material may be one or more of silicon, germanium, a silicon-germanium compound, and a silicon-carbon compound. It should be noted that, in some embodiments, the base 10 may be further internally provided with buried word lines, shallow trench isolation (STI) structures, active regions and other structures.

Referring to FIG. 1, the base 10 has an active region 100. The active region 100 may be provided on a top surface of the base 10 or on a bottom surface of the base 10. The active region 100 is provided with a source region 101 (referring to the dashed line box in FIG. 1), a gate region 102, and a drain region 103 (referring to the dashed line box in FIG. 1). The source region 101, the gate region 102, and the drain region 103 are sequentially adjacent to each other.

It should be noted that, in some embodiments, when the gate region 102 has a planar gate structure, a formed gate is subsequently formed on the surface of the base 10; when the gate region has a buried gate structure, the gate is subsequently formed in the base 10. In this embodiment, for example, the planar gate structure is formed in the gate region 102; in this case, a projection region of the gate region 102 on the base 10 corresponds to a channel region (not shown in the figure) in the active region 100, and the channel region is located between the source region 101 and the drain region 103.

In some embodiments, the planar gate structure in the gate region 102 includes a gate dielectric layer and a gate electrode. For example, the planar gate structure may include a high-K dielectric material and a conductive layer (such as a gate electrode) formed on the high-K dielectric material. The high-K dielectric material may include hafnium oxide, hafnium-silicon oxide, hafnium-silicon-nitrogen oxide, hafnium-tantalum oxide, hafnium-titanium oxide, hafnium-zirconium oxide or the like. The conductive layer may include, but is not limited to, polysilicon, titanium, titanium nitride, tantalum, tantalum nitride, tantalum carbide, and the like, and/or other suitable materials. One or more conductive layers are formed through processes such as physical vapor deposition, chemical vapor deposition, atomic layer deposition, and electroplating.

Referring to FIG. 1, the source region 101 and the drain region 103 of the active region 100 are provided at two sides of the gate region 102. In some embodiments, the source region 101 and the drain region 103 each may include a low-doped region. The low-doped region may be formed in the source region 101 and the drain region 103 through an ion implantation process, a diffusion process, or other suitable processes. In an example, the source region 101 and the drain region 103 may each include a silicon germanide region grown by using a suitable process.

It should be noted that, the source region 101 and the drain region 103 in this embodiment are merely an example. In other embodiments, the source region 101 and the drain region 103 may each further include another lightly doped source region and lightly doped drain region, or another heavily doped source region and heavily doped drain region formed through a suitable method. The lightly doped source region and the lightly doped drain region, or the heavily doped source region and the heavily doped drain region may be selected according to required transistor configurations.

Referring to FIG. 1 and FIG. 2, the first contact structures 20 are provided on the source region 101 and the drain region 103 respectively. The second contact structure 30 is provided on the gate region 102. It should be noted that, along a first direction X, a top surface of the second contact structure 30 is flush with a top surface of the first contact structure 20. With reference to FIG. 2, using an orientation shown in the figure as an example, the first direction X is an extension direction from a bottom surface of the base 10 to a top surface of the base 10.

Further referring to FIG. 1 and FIG. 2, the third contact structures 40 are provided on the first contact structure 20 and the second contact structure 30 respectively. An area of the top surface of the first contact structure 20 and an area of the top surface of the second contact structure 30 are both larger than an area of a bottom surface of the third contact structure 40.

A first interface 24 exists between the first contact structure 20 and the third contact structure 40. The first interface 24 is located in a corresponding region on the top surface of the first contact structure 20. In this case, the first interface 24 may refer to an intersection between the top surface of the first contact structure 20 and the top surface of the third contact structure 40, that is, a boundary shape of the first interface 24 may be the shape of the bottom surface of the third contact structure 40. It should be noted that, the interface shape of the first interface 24 may be a flat shape, a serrated shape or a wavy shape.

Similarly, a second interface 34 exists between the second contact structure 30 and the third contact structure 40. The second interface 34 is located in a corresponding region on the top surface of the second contact structure 30. In this case, the second interface 34 may refer to an intersection between the top surface of the second contact structure 30 and the top surface of the third contact structure 40, that is, a boundary shape of the second interface 34 may be the shape of the bottom surface of the third contact structure 40. It should be noted that, the interface shape of the second interface 34 may be a flat shape, a serrated shape or a wavy shape.

In this embodiment, the source region, the gate region, and the drain region sequentially adjacent to each other are provided in the active region on the top surface of the base; the first contact structures are provided on the source region and the drain region respectively, the second contact structure is provided on the gate region, and the third contact structures are provided on the first contact structure and the second contact structure respectively, where the area of the top surface of the first contact structure and the area of the top surface of the second contact structure are both larger than the area of the bottom surface of the third contact structure. The first contact structure and the second contract structure can effectively increase the contact area between the contact structure and the active region, thereby reducing the resistance of the contact structure and improving the performance of the semiconductor structure. On the other hand, the third contact structure can effectively ensure the conductivity of the connection with a subsequently formed semiconductor structure such as a capacitor structure, thereby ensuring the performance of the semiconductor structure. Meanwhile, due to the existence of the first interface between the first contact structure and the third contact structure and the second interface between the second contact structure and the third contact structure, the contact structure is formed by two molding operations. The process is simple and the yield is high. Moreover, it is unnecessary to etch the conductive layer in the first contact structure and the second contact structure, avoiding problems such as breakage or errors in etching.

As shown in FIG. 1, in some embodiments, the first contact structures 20 include an adhesive layer 21 and a conductive layer 22. The adhesive layer 21 in the first contact structure 20 is connected to the source region 101 and the drain region 103 of the active region 100, and the conductive layer 22 is provided on a top surface of the adhesive layer 21. It should be noted that, the conductive layer 22 is configured to ensure the connection with the subsequently formed third contact structure 40. In this embodiment, the adhesive layer 21 not only can ensure the conductivity between the conductive layer 22 and the active region 100, but also can improve the connection strength between the conductive layer 22 and the active region 100, thereby improving the performance and yield of the semiconductor structure.

Referring to FIG. 1, in some embodiments, a material of the adhesive layer 21 includes titanium nitride. The adhesive layer 21 may be formed on the top surfaces of the source region 101 and the drain region 103 of the active region 100 through a chemical vapor deposition process.

A material of the conductive layer 22 includes tungsten. In this embodiment, when the tungsten is in direct contact with silicon in the active region 100, the adhesion effect is poor and the tungsten is prone to diffusion. Therefore, titanium nitride is provided between the conductive layer 22 and the active region 100, where the titanium nitride may serve as an adhesive layer or a connection layer between the active region 100 and the conductive layer 22, which improves the connection strength between the conductive layer 22 and the active region 100 while ensuring the conductivity between the conductive layer 22 and the active region 100, thereby improving the performance of the semiconductor structure.

As shown in FIG. 1, in some embodiments, along the first direction X, the first contact structure 20 has a first preset height, where the first preset height is in a range of 110 nm to 130 nm. In an example, the height of the first contact structure 20 may be 110 nm, 120 nm or 130 nm. The first contact structure 20 with such a height can reduce the height of the semiconductor structure, and can also ensure the conductivity between the active region 100 and a subsequently formed semiconductor structure such as a capacitor structure.

As shown in FIG. 1, in some embodiments, along the first direction X, the third contact structure 40 has a second preset height, where the second preset height is in a range of 30 nm to 50 nm. In an example, the height of the third contact structure 40 may be 40 nm. The third contact structure 40 with such a height can ensure the conductivity between the first contact structure 20 and a subsequently formed semiconductor structure such as a capacitor structure, and can also reduce the height of the third contact structure 40. With a plane perpendicular to the first direction X as a cross section, a cross-sectional area of the first contact structure 20 is larger than a cross-sectional area of the third contact structure 40. Therefore, while the height of the third contact structure is reduced, the resistance of the third contact structure 40 can also be reduced, thereby improving the performance of the semiconductor structure. A material of the third contact structure 40 may include, but is not limited to, tungsten. In an example, the material of the third contact structure 40 may be the same as the material of the conductive layer 22, thereby reducing the manufacturing processes of the semiconductor structure while ensuring the conductivity of the contact structure.

In some embodiments, the height of the first contact structure 20 or the second contact structure 30 may be 2 to 4 times the height of the third contact structure 40. This can improve the stability of the contact structure while reducing the resistance of the contact structure as much as possible.

It should be noted that, in this embodiment, a total height of the first contact structure 20 and the third contact structure 40 is 160 nm, to reduce the total height of the semiconductor structure while ensuring the performance of the semiconductor structure.

As shown in FIG. 1, in some embodiments, along the first direction X, the height of the second contact structure 30 is less than or equal to the height of the first contact structure 20. When the gate region 102 is a planar gate, the height of the second contact structure 30 is less than the height of the first contact structure 20. When the gate region 102 is a buried gate structure, the height of the second contact structure 30 is equal to the height of the first contact structure 20.

In an example, the second contact structure 30 may be the same as the first contact structure. For example, the second contact structure 30 may include an adhesive layer and a conductive layer, where the thickness of the adhesive layer in the second contact structure 30 may be equal to the thickness of the adhesive layer in the first contact structure 20; however, the thickness of the conductive layer in the second contact structure 30 may be less than the thickness of the conductive layer in the first contact structure 20. In another example, the second contact structure 30 may only include the conductive layer.

It should be noted that, the material of the second contact structure 30 may be the same as the material of the first contact structure 20, to reduce the difficulty of the forming process of the first contact structure 20 and the second contact structure 30 and the production cycle of the semiconductor structure.

As shown in FIG. 1 and FIG. 2, in some embodiments, a contact layer 50 is provided between the first contact structure 20 and the source region 101, and between the first contact structure 20 and the drain region 103. A material of the contact layer 50 may include metal silicide, such as cobalt silicide. In an example, a height of the contact layer 50 is 8 nm to 12 nm. The height of the contact layer 50 may be 8 nm, 10 nm, or 12 nm. It should be noted that, the contact layer 50 is laid flat on the top surfaces of the source region 101 and the drain region 103, to increase the contact area between the first contact structure and the source region 101 and between the first contact structure 20 and the drain region 103. Moreover, the contact layer 50 formed by the metal silicide such as cobalt silicide has relatively low resistance. Therefore, the contact layer 50 can effectively reduce the resistance between the active region 100 and the contact structure, thereby improving the performance of the semiconductor structure.

Figure 3:
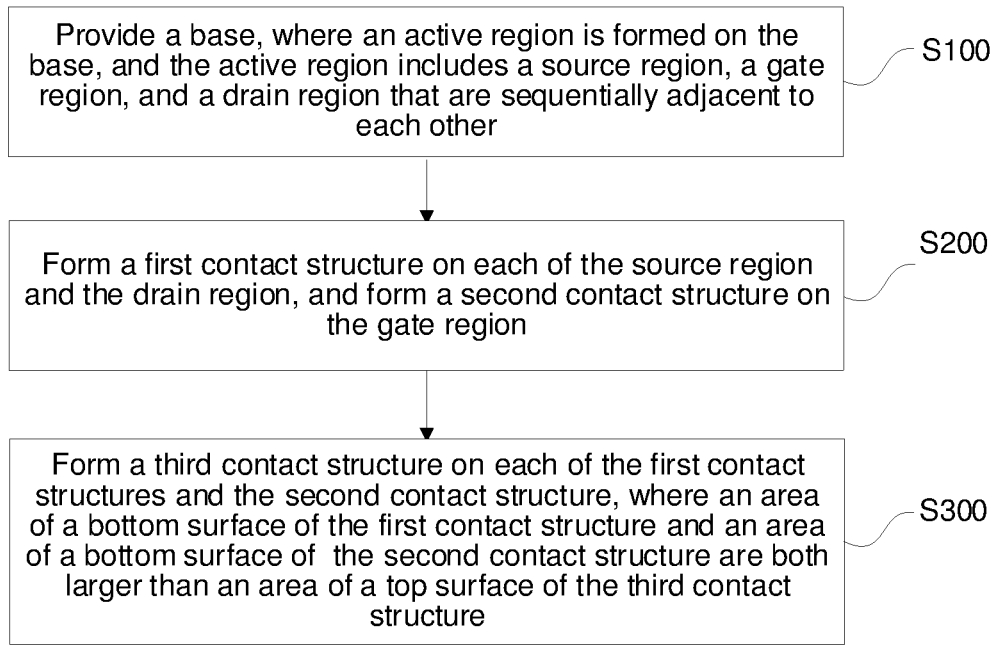
FIG. 3 is a flowchart of a method of manufacturing a semiconductor structure according to an exemplary embodiment.

As shown in FIG. 3, an exemplary embodiment of the present disclosure provides a method of manufacturing a semiconductor structure. The method of manufacturing a semiconductor structure includes:

Step S100: Provide a base, where an active region is formed on the base, and the active region includes a source region, a gate region, and a drain region that are sequentially adjacent to each other.

Step S200: Form a first contact structure on each of the source region and the drain region, and form a second contact structure on the gate region.

Step S300: Form a third contact structure on each of the first contact structures and the second contact structure, where an area of the bottom surface of the first contact structure and an area of the bottom surface of the second contact structure are both larger than an area of a top surface of the third contact structure.

In this embodiment, the source region, the gate region, and the drain region sequentially adjacent to each other are provided in the active region on the top surface of the base; the first contact structures are provided on the source region and the drain region respectively, the second contact structure is provided on the gate region, and then the third contact structures are provided on the first contact structure and the second contact structure respectively. The area of the top surface of the first contact structure and the area of the top surface of the second contact structure are both larger than the area of the bottom surface of the third contact structure. Therefore, with the cross-sectional size of the third contact structure remains unchanged, cross-sectional sizes of the first contact structure and the second contact structure are increased, which effectively increases the contact area between the contact structure and the active region in the semiconductor structure, thereby reducing the resistance of the contact structure and improving the performance of the semiconductor structure.

According to an exemplary embodiment, this embodiment is a further description of step S100 described above.

Figure 4:
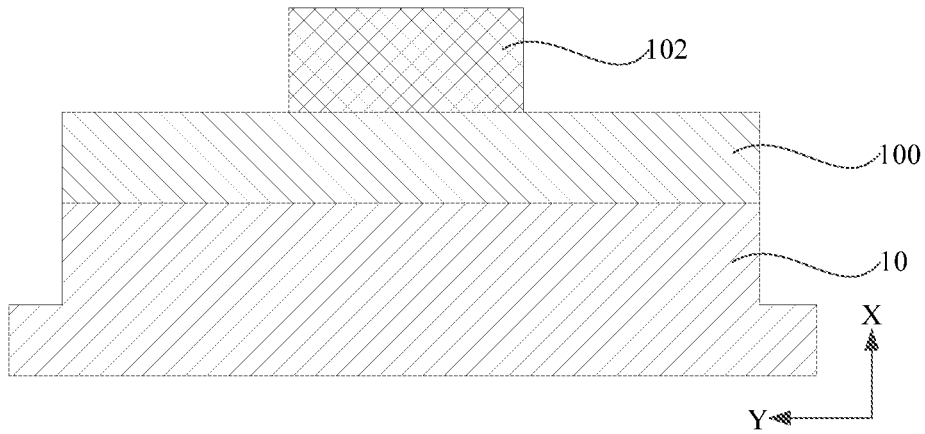
FIG. 4 is a schematic diagram of an active region in a method of manufacturing a semiconductor structure according to an exemplary embodiment.

As shown in FIG. 4, the base 10 is provided. The base 10 serves as a support member of a DRAM and is configured to support other components provided thereon. The base 10 may be made of a semiconductor material. The semiconductor material may be one or more of silicon, germanium, a silicon-germanium compound, and a silicon-carbon compound. In this embodiment, the base 10 is made of silicon. The use of silicon as the base 10 in this embodiment is to facilitate the understanding of the subsequent forming method by those skilled in the art, rather than to constitute a limitation. In an actual application process, an appropriate material of the base 10 may be selected according to needs.

Referring to FIG. 1 and FIG. 2, an active region 100 is formed on the top surface or bottom surface of the base 10. A source region 101, a gate region 102, and a drain region 103 sequentially adjacent to each other are provided in the active region 100. It should be noted that, for the source region 101, the gate region 102, and the drain region 103 in this embodiment, reference may be made to the above structure embodiments, and details are not described herein again.

Figure 6:
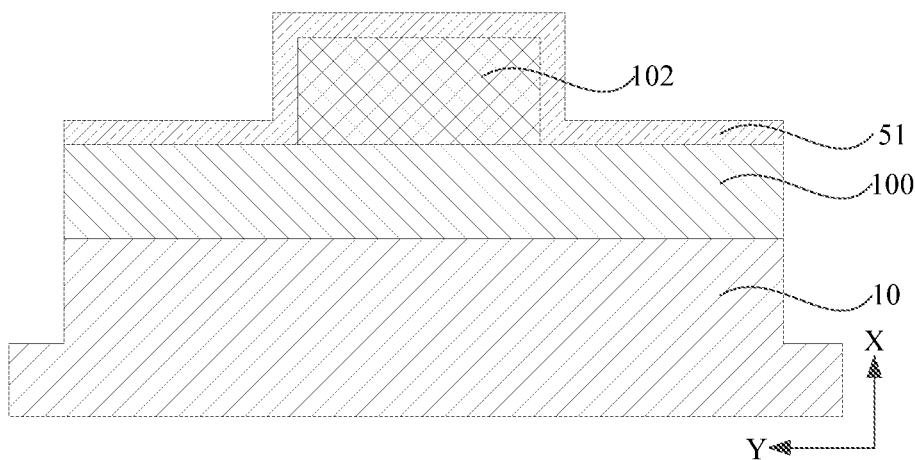
FIG. 6 is a schematic diagram of forming an initial contact layer in a method of manufacturing a semiconductor structure according to an exemplary embodiment.

As shown in FIG. 6, after the active region 100 is formed on the base 10, a contact layer 50 is formed on the top surface of the active region 100, where the contact layer 50 covers the source region and the drain region. In this embodiment, by forming the contact layer 50 on the source region and the drain region, the contact area with the subsequently formed first contact structure 20 is increased. Meanwhile, the contact layer 50 is formed on the surface of the active region 100, which can reduce the longitudinal size of the subsequently formed contact structure, thereby reducing the resistance of the contact structure and improving the performance of the semiconductor structure. It should be noted that, in this embodiment, the contact structure includes a first contact structure 20 and a third contact structure 40. The longitudinal size of the contact structure refers to a size along an extension direction from a front surface of the base 10 to a rear surface of the base 10.

Figure 5:
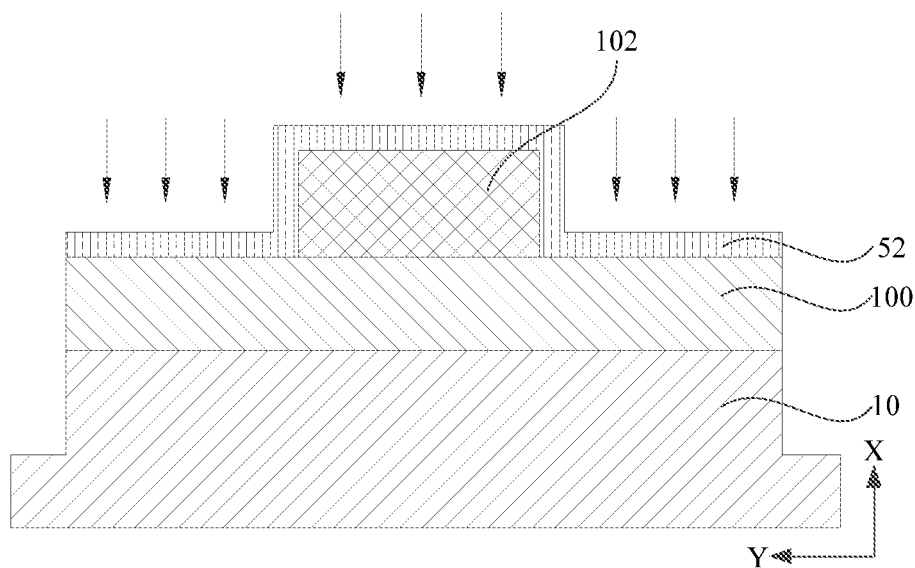
FIG. 5 is a schematic diagram of forming a cobalt layer in a method of manufacturing a semiconductor structure according to an exemplary embodiment.
Figure 7:
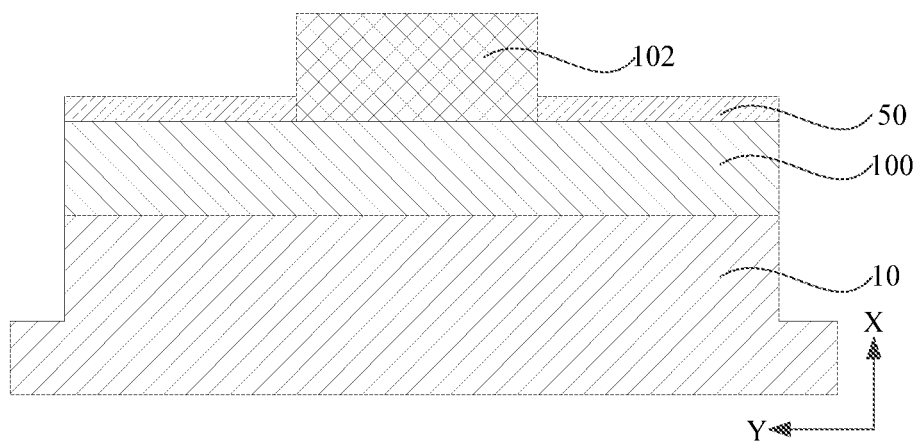
FIG. 7 is a schematic diagram of forming a contact layer in a method of manufacturing a semiconductor structure according to an exemplary embodiment.

In some embodiments, to facilitate forming of the contact layer 50 on the active region 100, the contact layer 50 may be formed through the following method: Referring to FIG. 5 to FIG. 7, an initial contact layer 51 is formed on the active region 100 by using an atomic layer deposition process, a physical vapor deposition process, or a chemical vapor deposition process, where the initial contact layer 51 covers the source region, the gate region, and the drain region. It should be noted that, in this embodiment, forming a planar gate structure on the gate region 102 is taken as an example for description. Therefore, the initial contact layer 51 in this embodiment further covers a side wall of the gate region 102.

Then, a part of the initial contact layer 51 on the top surface and side wall of the gate region 102 is removed through etching, and a part of the initial contact layer 51 on the top surface of the source region 101 and the top surface of the drain region 103 is remained. The remaining part of the initial contact layer 51 forms the contact layer 50.

In this embodiment, the contact layer 50 formed by the metal silicide such as cobalt silicide has relatively low resistance. Therefore, the contact layer 50 can effectively reduce the resistance between the active region 100 and the contact structure, thereby improving the performance of the semiconductor structure.

In some embodiments, referring to FIG. 5, the initial contact layer 51 may be formed by using the following method:

After the source region and the drain region of the active region 100 are formed, a cobalt layer 52 is formed on the surface of the active region 100 by using a chemical vapor deposition process. Then, at a processing temperature of 650° C. to 800° C., the cobalt layer 52 reacts with silicon on the surface of the active region 100 through a rapid thermal process (RTP), that is, the cobalt layer 52 reacts with the silicon material in the source region and the drain region to form a cobalt silicide layer. In this way, the initial contact layer 51 is formed on the top surface of the active region 100. In an example, the temperature of the rapid thermal process on the cobalt layer 52 may be set to 750° C., and the time for the rapid thermal process may be set to 30 s.

In this embodiment, the rapid thermal process is performed on the cobalt layer 52, such that the cobalt layer 52 reacts with silicon on the surface of the source region and the drain region to generate the cobalt silicide layer, thereby quickly forming the initial contact layer 51 on the active region 100. The forming method of the initial contact layer 51 is simple and easy to operate, which can reduce the manufacturing time and cost of the semiconductor structure.

According to an exemplary embodiment, this embodiment is a further description of step S200.

Figure 8:
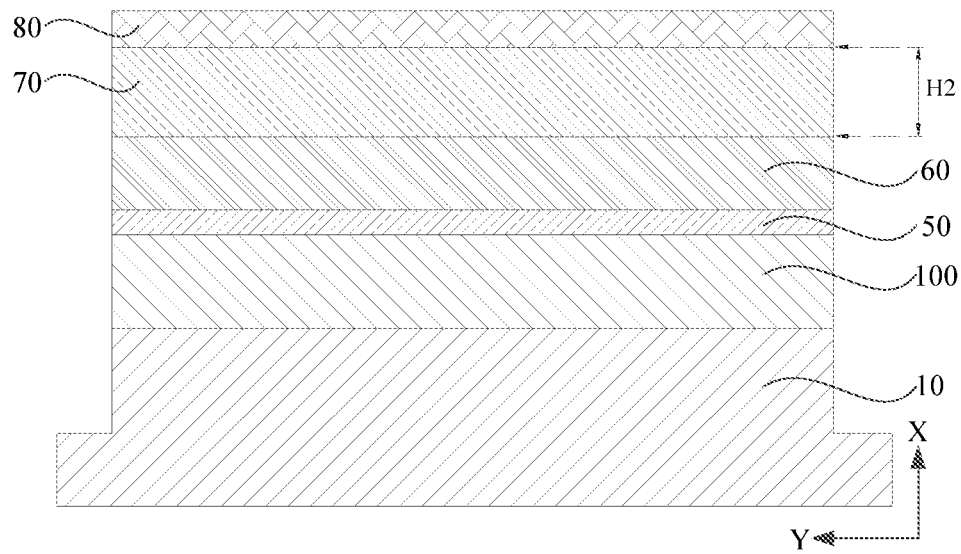
FIG. 8 is a schematic diagram of forming a dielectric layer and a first hard mask layer in a method of manufacturing a semiconductor structure according to an exemplary embodiment.
Figure 10:
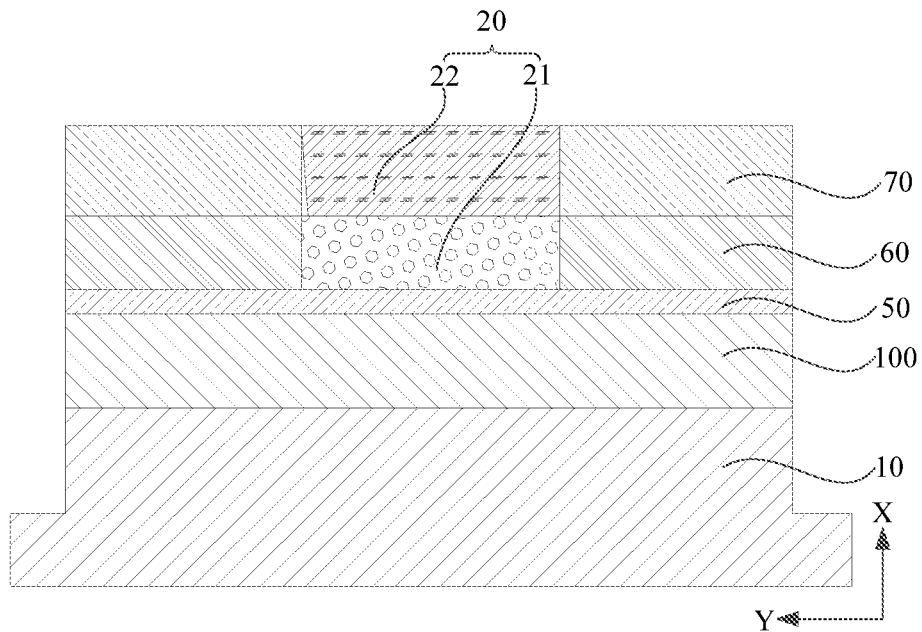
FIG. 10 is a schematic diagram of forming a first contact structure in a method of manufacturing a semiconductor structure according to an exemplary embodiment.

As shown in FIG. 2, FIG. 8 and FIG. 10, the first contact structures 20 are formed on the source region and the drain region, and the second contact structure 30 is formed on the gate region.

In some embodiments, the first contact structure 20 and the second contact structure 30 may be formed by using the following method:

Referring to FIG. 8, a dielectric layer 60 and a first hard mask layer 70 that are laminated are formed on the contact layer 50 through an atomic layer deposition process, a physical vapor deposition process, or a chemical vapor deposition process. In an example, a material of the dielectric layer 60 may include, but is not limited to, Boro Phosphor Silicate Glass (BPSG). A material of the first hard mask layer 70 may include, but is not limited to, silicon nitride or silicon oxide. In an example, the top surface of the dielectric layer 60 may be flush with the top surface of the gate region 102. In this embodiment, the first hard mask layer 70 has a first preset thickness H2. The first preset thickness H2 is in a range of 60 nm to 100 nm. It should be noted that, when the first preset thickness H2 is less than 60 nm, the conductive layer 22 formed in the first contact holes 90 and the second contact hole 130 is relatively thin, which reduces the conductivity between the contact structure and a subsequently formed semiconductor structure such as a capacitor structure. When the first preset thickness H2 is greater than 100 nm, the adhesive layer 21 is relatively thin, which reduces the adhesion effect and connection strength between the conductive layer 22 and the active region 100, thus reducing the performance of the semiconductor structure. Therefore, in an example, the first preset thickness H2 may be set to 80 nm, such that the thickness of the subsequently formed conductive layer 22 (referring to FIG. 9) is 80 nm, thereby improving the connection strength between the conductive layer 22 and the active region 100 while ensuring the conductivity between them.

A total thickness of the dielectric layer 60 and the first hard mask layer 70 is a first preset height, where the first preset height is in a range from 110 nm to 130 nm.

Then, further referring to FIG. 8, a first photoresist layer 80 is formed on the first hard mask layer 70 by using an atomic layer deposition process, a physical vapor deposition process, or a chemical vapor deposition process, and then exposure is performed on the first photoresist layer 80 to form a first patterned shape.

By using the first photoresist layer 80 having a first patterned shape as a mask, a part of the first hard mask layer 70 and a part of the dielectric layer 60 are removed through etching, to form the first contact holes 90 in the regions corresponding to the source region and the drain region, and form the second contact hole 130 in the region corresponding to the gate region.

Figure 9:
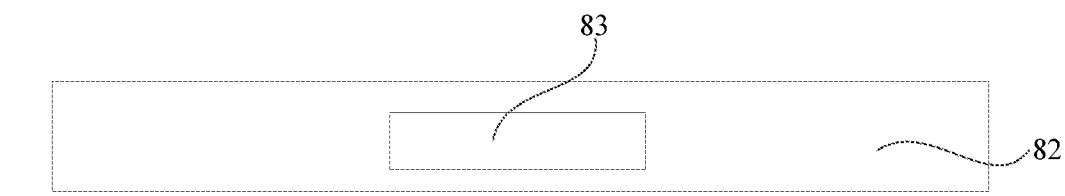
FIG. 9 is a schematic diagram of forming a first contact hole and a second contact hole in a method of manufacturing a semiconductor structure according to an exemplary embodiment.
Figure 9:
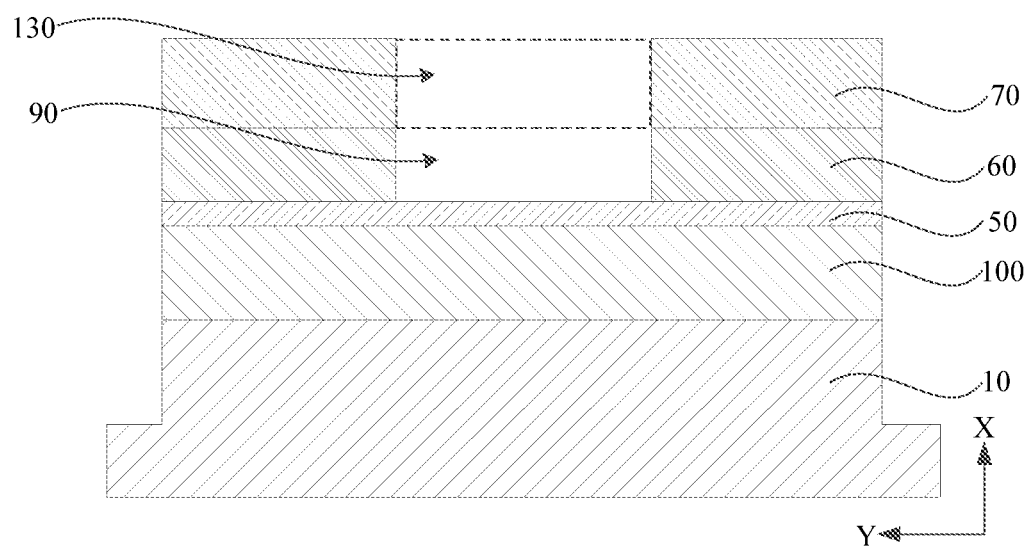

It should be noted that, in other embodiments, referring to FIG. 9, the first contact holes 90 and the second contact holes 130 may further be formed by using the following method:

A photomask 82 having a mask pattern 83 is provided, and a first patterned shape is formed on the first photoresist layer 80 by using the photomask.

By using the first photoresist layer 80 having the first patterned shape as a mask, a part of the first hard mask layer 70 and a part of the dielectric layer 60 are removed through etching, to form the first contact holes 90 in the regions corresponding to the source region and the drain region, and form the second contact hole 130 in the region corresponding to the gate region.

After the first contact hole 90 and the second contact hole 130 are formed, referring to FIG. 10, the adhesive layer 21 is formed in the first contact holes 90 by using an atomic layer deposition process, a chemical vapor deposition process, or a physical vapor deposition process. A deposition thickness of the adhesive layer 21 may be the same as the thickness of the dielectric layer 60. A material of the adhesive layer 21 may include, but is not limited to, titanium nitride.

After the adhesive layer 21 is formed through deposition, the conductive layer 22 is formed on the adhesive layer 21 and in the second contact hole 130 by using an atomic layer deposition process, a chemical vapor deposition process, or a physical vapor deposition process. The top surface of the conductive layer 22 is flush with the top surface of the first hard mask layer 70. The part of the conductive layer 22 and the part of the adhesive layer 21 in the first contact hole 90 form the first contact structure 20, and the part of the conductive layer 22 in the second contact hole 130 forms the second contact structure 30.

A material of the conductive layer 22 may include, but is not limited to, tungsten. In this embodiment, when the tungsten in the conductive layer 22 is in direct contact with silicon in the active region 100, the adhesion effect is poor and the tungsten is prone to diffusion. Therefore, titanium nitride is provided between the conductive layer 22 and the active region 100, where the titanium nitride may serve as an adhesive layer or a barrier layer between the active region 100 and the conductive layer 22, which improves the connection strength between the conductive layer 22 and the active region 100 while ensuring the conductivity between the conductive layer 22 and the active region 100, thereby improving the performance of the semiconductor structure.

According to an exemplary embodiment, this embodiment is a further description of forming the first contact holes 90 and the second contact holes 130.

In some embodiments, referring to FIG. 8 and FIG. 9, by using the first photoresist layer 80 having the first patterned shape as a mask, the exposed part of the first hard mask layer 70 is etched by using a first etching gas to expose the dielectric layer 60. The first etching gas includes oxygen, carbon-based sulfide gas or a mixed gas of oxygen and carbon-based sulfide gas. An etching time for the first hard mask layer 70 ranges from 60 s to 80 s, and an etching temperature for the first hard mask layer 70 ranges from 12 degrees Celsius to 18 degrees Celsius.

Then, the exposed part of the dielectric layer 60 is etched by using a second etching gas. The second etching gas includes oxygen, carbon tetrafluoride, or a mixed gas of oxygen and carbon tetrafluoride. An etching time for the dielectric layer 60 ranges from 80 s to 100 s, and an etching temperature for the dielectric layer 60 ranges from 12 degrees Celsius to 18 degrees Celsius.

Then, the first photoresist layer 80 is removed through etching.

In this embodiment, by setting the etching time and etching temperature of two different etching gases, the first hard mask layer 70 and the dielectric layer 60 are etched accurately, to improve the etching accuracy.

It should be noted that, in an example, the first etching gas and the second etching gas may have a same etching temperature. For example, the etching temperature is set to 15 degrees Celsius; the etching time of the first etching gas is set to 75 s, and the etching time of the second etching gas is set to 90 s. Therefore, in this embodiment, after the first etching gas finishes etching the first hard mask layer 70, the first etching gas is switched to be the second etching gas. In this case, the dielectric layer 60 can be etched without changing the etching temperature in the process chamber, which effectively improves the etching efficiency and reducing the time cost and production cost of the manufacturing process of the semiconductor structure.

According to an exemplary embodiment, this embodiment is a further description of step S300 described above.

Figure 11:
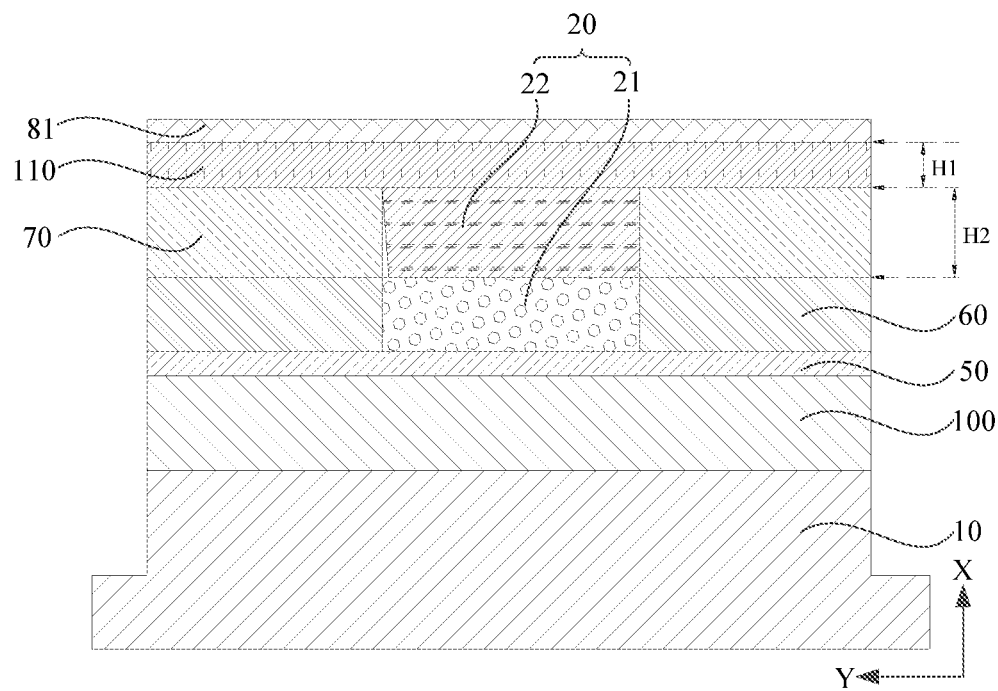
FIG. 11 is a schematic diagram of forming a second hard mask layer in a method of manufacturing a semiconductor structure according to an exemplary embodiment.

As shown in FIG. 11, in some embodiments, the second hard mask layer 110 is formed on the retained first hard mask layer 70 by using an atomic layer deposition process, a chemical vapor deposition process or a physical vapor deposition process. The second hard mask layer 110 has a second preset thickness H1. It should be noted that, the second preset thickness H1 may be the same as the second preset height, that is, the second preset thickness H1 ranges from 30 nm to 50 nm. In an example, the second preset thickness H1 may be 40 nm.

Figure 12:
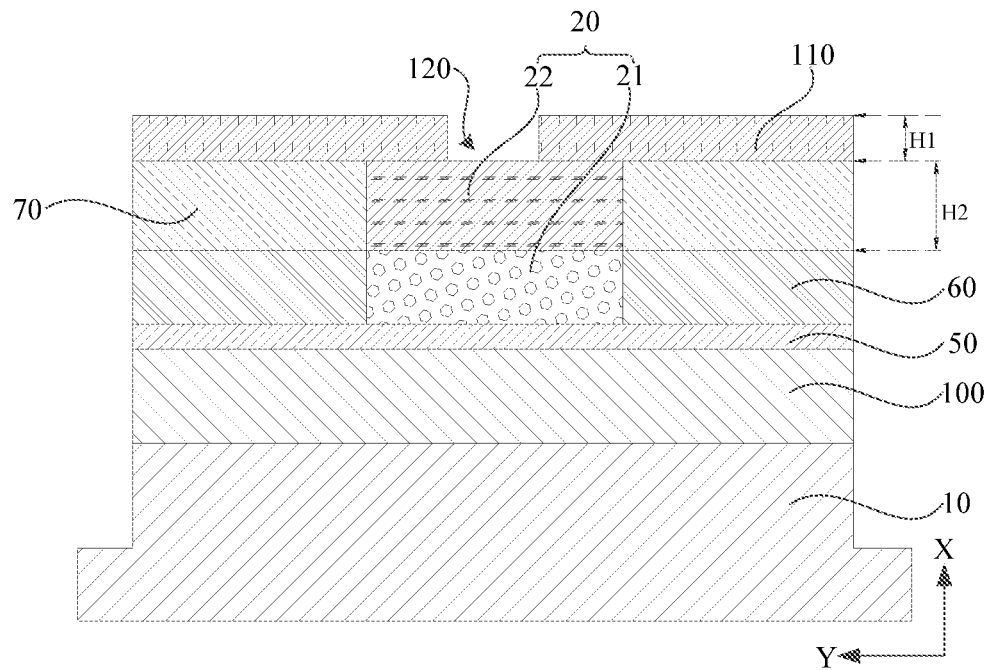
FIG. 12 is a schematic diagram of forming a third contact hole in a method of manufacturing a semiconductor structure according to an exemplary embodiment.

Then, as shown in FIG. 12, the third contact holes 120 are formed on the second hard mask layer 110. The third contact holes 120 expose the top surfaces of the first contact structures 20 and the top surface of the second contact structure 30. Along the second direction Y, the width of the third contact hole 120 is smaller than the width of the first contact hole 90. With reference to FIG. 11, using an orientation shown in the figure as an example, the second direction Y is an extension direction from a front surface of the base 10 to a rear surface of the base 10.

In some embodiments, the third contact holes 120 may be formed by using the following method.

Referring to FIG. 11, the second photoresist layer 81 is formed on the second hard mask layer 110 by using an atomic layer deposition process, a physical vapor deposition process, or a chemical vapor deposition process, and exposure is performed on the second photoresist layer 81 to form a second patterned shape.

Then, by using the second photoresist layer 81 having the second patterned shape as a mask, a part of the second hard mask layer 110 is removed through etching. In this way, the third contact holes 120 are formed on the second hard mask layer 110. It should be noted that, with a plane parallel to the top surface of the base 10 as a cross section, a cross-sectional length of the third contact hole 120 is less than a cross-sectional length of the first contact hole 90 or the second contact hole 130, and a cross-sectional width of the third contact hole 120 is less than a cross-sectional width of the first contact hole 90 or the second contact hole 130.

Figure 13:
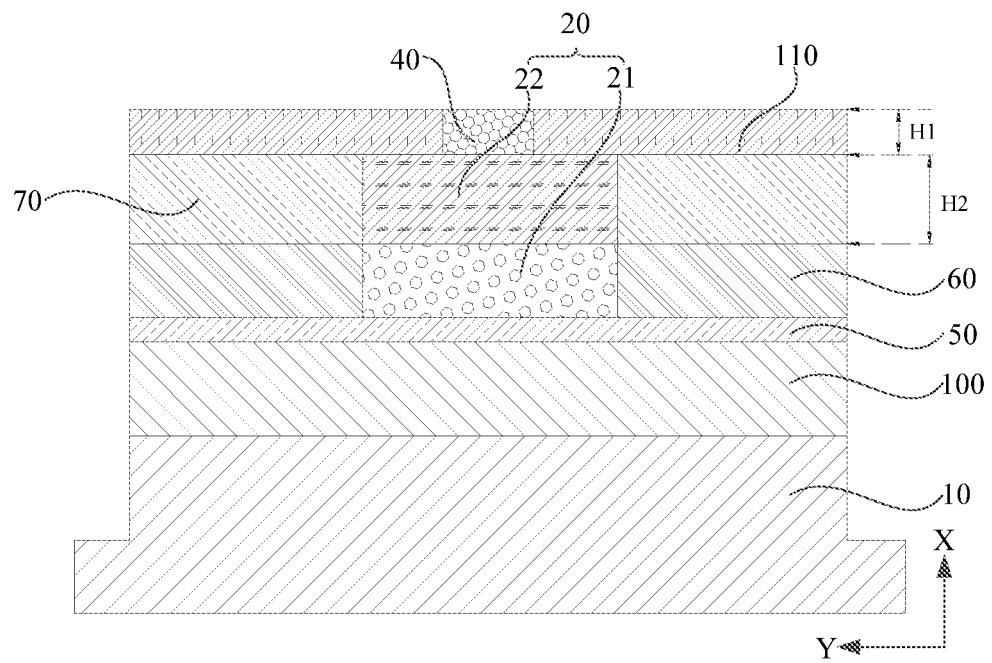
FIG. 13 is a schematic diagram of forming a third contact structure in a method of manufacturing a semiconductor structure according to an exemplary embodiment.

Then, referring to FIG. 13, the third contact structure 40 is formed in the third contact hole 120 (referring to FIG. 12) by using an atomic layer deposition process, a chemical vapor deposition process, or a physical vapor deposition process.

After the third contact structure 40 is formed, chemical mechanical polishing may be performed on the top surface of the third contact structure 40, such that the top surface of the third contact structure 40 is flush with the top surface of the second hard mask layer 110, to ensure a forming height of the third contact structure 40, thereby ensuring forming heights of the contact structures (the first contact structure 20 and the third contact structure 40) corresponding to the source region 101 and the drain region 103. In an example, the forming height of the first contact structure 20 is 120 nm, and the forming height of the third contact structure 40 is 40 nm. Therefore, the forming height of the contact structure is 160 nm. The contact structure with such a height can ensure the connection strength and conductivity with the active region 100, and also ensure the conductivity with a subsequently formed semiconductor structure such as a capacitor structure.

Finally, the second photoresist layer 81 is removed.

It should be noted that, in some embodiments, the wiring of a subsequently formed metal interconnect layer restricts the width at the top of the third contact structure 40 along the second direction Y Therefore, in this embodiment, the contact layer 50 is formed between the first contact structure 20 and the active region 100 to reduce the resistance between the first contact structure 20 and the active region 100. On the other hand, by increasing the cross-sectional sizes of the first contact structure 20 and the second contact structure 30, the contact area between the first contact structure 20 and the active region 100 is increased, and the width of the third contact structure 40 along the second direction Y is also reduced, thereby further reducing the resistance of the contact structure and improving the performance of the semiconductor structure.

Figure 14:
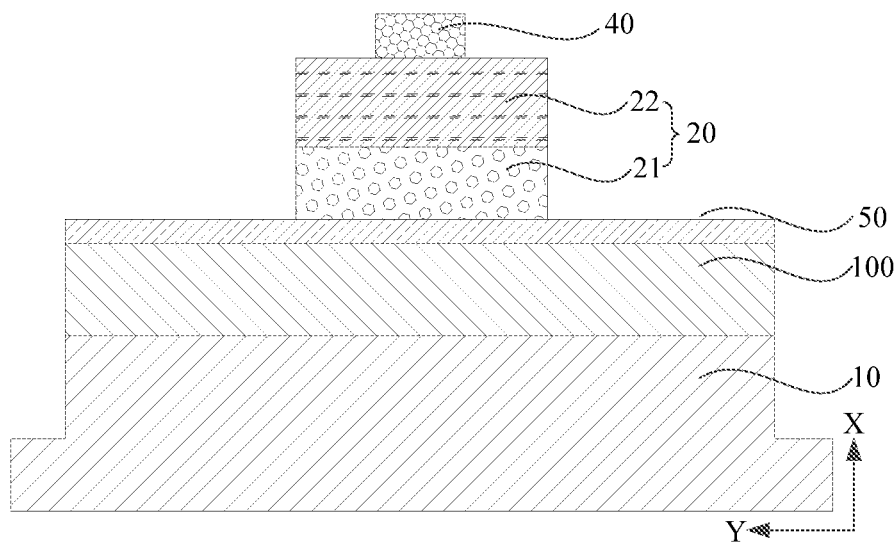
FIG. 14 is a schematic diagram of removing a second hard mask layer, a first hard mask layer, and a dielectric layer in a method of manufacturing a semiconductor structure according to an exemplary embodiment.

As shown in FIG. 14, in some embodiments, to facilitate subsequent forming of other semiconductor structures or other processes, the remaining part of the second hard mask layer 110, the remaining part of the first hard mask layer 70, and the remaining part of the dielectric layer 60 are removed through etching.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of manufacturing a semiconductor structure, comprising:
    providing a base, wherein an active region is formed on the base, and the active region comprises a source region, a gate region, and a drain region that are sequentially adjacent to each other;
    forming a first contact structure on each of the source region and the drain region, and forming a second contact structure on the gate region; and
    forming a third contact structure on each of the first contact structures and the second contact structure, wherein an area of a bottom surface of the first contact structure and an area of a bottom surface of the second contact structure are both larger than an area of a top surface of the third contact structure, further comprising:
    forming a contact layer on the active region, wherein the contact layer covers the source region and the drain region;
    wherein the forming a contact layer on the active region comprises:
        forming an initial contact layer on the active region, wherein the initial contact layer covers the source region, the gate region, and the drain region; and
        removing a part of the initial contact layer on a top surface and a side wall of the gate region, wherein a remaining part of the initial contact layer forms the contact layer.

2. The method of manufacturing a semiconductor structure according to claim 1, wherein the forming an initial contact layer on the active region comprises:
    forming a cobalt layer on the active region; and
    performing a thermal process on the cobalt layer at a processing temperature of 650° C. to 800° C., wherein the cobalt layer reacts with silicon on a surface layer of the active region to form a cobalt silicide layer, and the cobalt silicide layer forms the initial contact layer.

3. The method of manufacturing a semiconductor structure according to claim 1, wherein forming the first contact structures and the second contact structure comprises:
    forming a dielectric layer and a first hard mask layer that are laminated on a contact layer;
    forming a first photoresist layer having a first patterned shape on the first hard mask layer;
    removing a part of the first hard mask layer and a part of the dielectric layer by using the first photoresist layer as a mask to form a plurality of first contact holes and a second contact hole;
    forming an adhesive layer in the first contact holes; and
    forming a conductive layer on the adhesive layer and in the second contact hole, wherein a top surface of the conductive layer is flush with a top surface of the first hard mask layer, a part of the adhesive layer and a part of the conductive layer in the first contact hole form the first contact structure, and a part of the conductive layer in the second contact hole forms the second contact structure.

4. The method of manufacturing a semiconductor structure according to claim 3, wherein the removing a part of the first hard mask layer and a part of the dielectric layer by using the first photoresist layer as a mask to form a plurality of first contact holes and a second contact hole comprises:
    etching an exposed part of the first hard mask layer through a first etching gas by using the first photoresist layer as the mask, to expose the dielectric layer, wherein an etching time for the first hard mask layer ranges from 60 s to 80 s, and an etching temperature for the first hard mask layer ranges from 12 degrees Celsius to 18 degrees Celsius;
    etching an exposed part of the dielectric layer through a second etching gas, wherein an etching time for the dielectric layer ranges from 80 s to 100 s, and an etching temperature for the dielectric layer ranges from 12 degrees Celsius to 18 degrees Celsius; and
    removing the first photoresist layer.

5. The method of manufacturing a semiconductor structure according to claim 3, wherein the forming a third contact structure on each of the first contact structures and the second contact structure comprises:
    forming a second hard mask layer on the first hard mask layer;
    forming a second photoresist layer having a second patterned shape on the second hard mask layer;

removing a part of the second hard mask layer by using the second photoresist layer as a mask, to form third contact holes on the second hard mask layer, wherein the third contact holes expose top surfaces of the first contact structures and a top surface of the second contact structure, and along a second direction, a width of the third contact hole is smaller than a width of the first contact hole;

forming the third contact structure in the third contact hole; and removing the second photoresist layer.

6. The method of manufacturing a semiconductor structure according to claim 5, further comprising:
removing a remaining part of the second hard mask layer, a remaining part of the first hard mask layer, and a remaining part of the dielectric layer.

7. A method of manufacturing a semiconductor structure, comprising:
providing a base, wherein an active region is formed on the base, and the active region comprises a source region, a gate region, and a drain region that are sequentially adjacent to each other;

forming a first contact structure on each of the source region and the drain region, and forming a second contact structure on the gate region; and forming a third contact structure on each of the first contact structures and the second contact structure, wherein an area of a bottom surface of the first contact structure and an area of a bottom surface of the second contact structure are both larger than an area of a top surface of the third contact structure;

wherein forming the first contact structures and the second contact structure comprises:
forming a dielectric layer and a first hard mask layer that are laminated on a contact layer;

forming a first photoresist layer having a first patterned shape on the first hard mask layer;

removing a part of the first hard mask layer and a part of the dielectric layer by using the first photoresist layer as a mask to form a plurality of first contact holes and a second contact hole;

forming an adhesive layer in the first contact holes; and forming a conductive layer on the adhesive layer and in the second contact hole, wherein a top surface of the conductive layer is flush with a top surface of the first hard mask layer, a part of the adhesive layer and a part of the conductive layer in the first contact hole form the first contact structure, and a part of the conductive layer in the second contact hole forms the second contact structure.

8. The method of manufacturing a semiconductor structure according to claim 7, wherein the removing a part of the first hard mask layer and a part of the dielectric layer by using the first photoresist layer as a mask to form a plurality of first contact holes and a second contact hole comprises:
etching an exposed part of the first hard mask layer through a first etching gas by using the first photoresist layer as the mask, to expose the dielectric layer, wherein an etching time for the first hard mask layer ranges from 60 s to 80 s, and an etching temperature for the first hard mask layer ranges from 12 degrees Celsius to 18 degrees Celsius;

etching an exposed part of the dielectric layer through a second etching gas, wherein an etching time for the dielectric layer ranges from 80 s to 100 s, and an etching temperature for the dielectric layer ranges from 12 degrees Celsius to 18 degrees Celsius; and removing the first photoresist layer.

9. The method of manufacturing a semiconductor structure according to claim 7, wherein the forming a third contact structure on each of the first contact structures and the second contact structure comprises:
forming a second hard mask layer on the first hard mask layer;

forming a second photoresist layer having a second patterned shape on the second hard mask layer;

removing a part of the second hard mask layer by using the second photoresist layer as a mask, to form third contact holes on the second hard mask layer, wherein the third contact holes expose top surfaces of the first contact structures and a top surface of the second contact structure, and along a second direction, a width of the third contact hole is smaller than a width of the first contact hole;

forming the third contact structure in the third contact hole; and removing the second photoresist layer.

10. The method of manufacturing a semiconductor structure according to claim 9, further comprising:
removing a remaining part of the second hard mask layer, a remaining part of the first hard mask layer, and a remaining part of the dielectric layer.

* * * * *